United States Patent [19]

Ahuja

[11] Patent Number: 4,669,112
[45] Date of Patent: May 26, 1987

[54] AUTOMATIC TELEPHONE NUMBER INDICATING DEVICE

[76] Inventor: Om Ahuja, 89 Clearmeadow Dr., East Meadow, N.Y. 11554

[21] Appl. No.: 753,720

[22] Filed: Jul. 10, 1985

Related U.S. Application Data

[63] Continuation-in-part of Ser. No. 633,107, Jul. 20, 1984, abandoned.

[51] Int. Cl.$^4$ ............................................ H04M 15/36
[52] U.S. Cl. .................................................... 379/183
[58] Field of Search ................. 179/175.3 R, 175.3 F, 179/175, 175.1 R, 81 R, 17 A, 99 R, 18 F H, 27 E; 307/252 B, 252 T; 324/52

[56] References Cited

U.S. PATENT DOCUMENTS

| | | | |
|---|---|---|---|
| 3,916,111 | 10/1975 | Ott | 179/17 E |
| 4,021,617 | 5/1977 | Jones, Jr. et al. | 179/17 E |
| 4,054,942 | 10/1977 | Chambers, Jr. | 179/17 A |
| 4,056,694 | 11/1977 | Brolin | 179/84 R |
| 4,079,205 | 3/1978 | Glenn | 179/17 A |
| 4,099,031 | 7/1978 | Proctor et al. | 179/17 A |
| 4,149,040 | 4/1979 | Atkinson | 179/17 A |
| 4,209,667 | 6/1980 | Simokat | 179/17 A |
| 4,221,935 | 9/1980 | Barsellotti et al. | 179/17 E |
| 4,293,737 | 10/1981 | Cepelinski | 179/17 E |
| 4,310,723 | 1/1982 | Svala | 179/17 A |
| 4,323,799 | 4/1982 | King et al. | 307/571 |
| 4,324,953 | 4/1982 | Simokat | 179/17 A |
| 4,331,838 | 5/1982 | Simokat | 179/17 E |
| 4,373,121 | 2/1983 | Sartori et al. | 179/175.3 F |
| 4,396,809 | 8/1983 | Brunssen | 179/175.3 F |
| 4,403,115 | 9/1983 | Simokat | 179/17 A |
| 4,438,299 | 3/1984 | Tomin | 179/175.3 F |
| 4,445,001 | 4/1984 | Bertoglio | 179/17 A |
| 4,489,221 | 12/1984 | Walker et al. | 179/19 |
| 4,529,847 | 7/1985 | DeBalko | 179/175.3 F |

OTHER PUBLICATIONS

*General Electric*, published by Prentice Hall Inc., N.J. "SCR Manual Sixth Edition" pp. 435–436.
*Bell Laboratories Record*, "Switching to Solid State Relays", pp. 31–37, published in February 1978.
Disclosure Document No. 119121, filed Jul. 27, 1983 for "Maintenance Termination Unit" (Per Bell Pub: 55022.

*Primary Examiner*—Stafford D. Schreyer
*Attorney, Agent, or Firm*—Scully, Scott, Murphy & Presser

[57] ABSTRACT

An automatic telephone number indicating device for connection within the tip or ring line of a telephone circuit of one party of a multi-party circuit for applying a ground mark in response to an interrogation signal from the telephone central office when the party having the device has taken the phone off hook including a current detection circuit connected within the remote telephone circuit for detecting a current caused by the phone being placed off hook. An enable circuit is triggered by the current detection circuit and is held triggered by a time constant circuit for a predetermined time period. A ground mark circuit connects the ground mark between the ground and the tip line or tip and ring lines. A voltage monitor circuit is rendered conductive in response to a voltage across the tip and ring lines, which disables the ground mark circuit. The central office interrogates the circuit by removing the voltage across the tip and ring lines thereby permitting the ground mark to be applied. The central office will then test for a ground mark between ground and the tip line or tip and ring lines. The presence of the ground mark indicates the party having the device is off hook.

16 Claims, 2 Drawing Figures

AUTOMATIC TELEPHONE NUMBER INDICATING DEVICE

CROSS-REFERENCE TO RELATED APPLICATION

This application is a continuation-in-part of the applicant's pending application "Remote Actuated Switch" Ser. No. 633,107, filed July 20, 1984 abandoned.

BACKGROUND OF THE INVENTION

The present invention relates to a device for connection within a telephone circuit, particularly a multiparty telephone circuit, to permit the central office to determine which party is making an outgoing phone call for billing purposes.

In multiparty telephone systems, the central office must be able to determine which party is making an outgoing call in order to properly bill that party. In the past, the telephone company provided one party of a two party line with a phone that would produce a special signal that could be detected by the central office when that party placed his phone off hook. Each party's phone is branched off the tip and ring line of the telephone system. Generally, one party is designated the tip party and the other party is designated the ring party. A tip party identifier was provided by giving the tip party of the two party system a telephone specially designed to produce an identifying signal at the central office when that phone is off hook. When one party takes their phone off hook to make a call, the central office would test for this signal and if the signal was seen they would know that the tip party was making the call and if that signal was not seen, the central office would know that the ring party was making the call.

In the present deregulated environment, it is now mandatory that the customer be able to buy and own his own equipment by going to any FCC approved manufacturer or supplier for the phone. Thus, there is a need for a separate device to be connected within one party's telephone loop in order to produce a signal that can be detected by the central office when that party's phone is off hook. The device must be able to detect when the phone is off hook and produce the identifying signal only when the central office is testing for that signal.

SUMMARY OF THE INVENTION

The automatic telephone number indicating device of the present invention is designed for connection within the telephone loop of one party of a multiparty system. The device permits the telephone central office to detect a ground mark in the telephone circuit in response to the party's telephone being off hook. The central office can detect the ground mark by placing an interrogation signal across the circuit and testing for a resistance or current between the circuit and ground.

In a two party system, each party has their individual telephone sets connected to separate tip and ring lines which branch off of the remote tip and ring circuit coming from the telephone central office. The device of the present invention includes a current detection circuit connected within one of the tip or ring lines of one party's remote telephone loop. When the party having the device in the loop takes his phone off hook to make a call, there is generated through the telephone loop a current flow that is detected by the current detection circuit. The detection circuit may include a current protection means that conducts the current after the detection means has been triggered thereby relieving the current detection circuit of current.

A ground mark enable circuit is triggered on by the current detection circuit to permit a ground mark to be detected by the central office. A ground mark is a current path to ground through a resistor that is detected by the central office. The enable circuit permits the ground mark to be seen for a predetermined time period. A ground mark latching circuit connects the ground mark between ground and the tip leg or between ground and tip and ring.

A ground mark disable circuit is connected across the tip and ring loop to disable the ground mark circuit in response to a voltage being across the tip and ring line. The disable circuit is rendered nonconductive or inoperative in response to an interrogation signal from the central office. The interrogation signal is provided by the central office by removing the potential difference between the tip and ring lines. Thus, the ground mark will be applied by the automatic telephone number indicating device in response to the presence of the interrogation signal from the central office during the time period that the enable circuit is on, thereby indicating that the party having the device is off hook.

The ground mark latching circuit may include a latching means to hold the ground mark on the line beyond the time period that the enabled circuit is operative. The disable circuit may include a diode bridge connected between the tip and ring lines to permit the disable circuit to operate regardless of the polarity of the voltage in the telephone loop. Furthermore, a balancing means may be provided in the tip or ring line not having the switch to compensate for the bilateral switch connected within the other line.

DETAILED DESCRIPTION OF THE INVENTION

Figure 1:
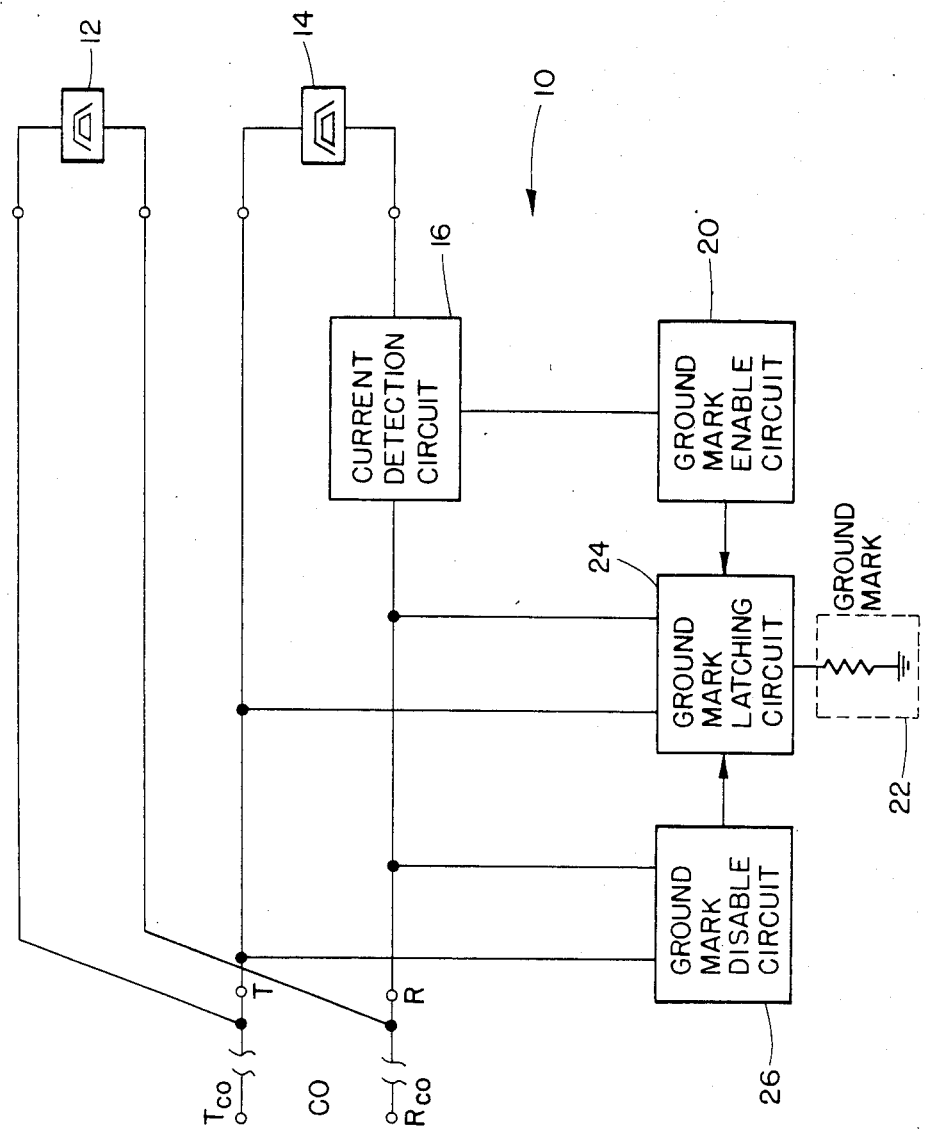
FIG. 1 is a block diagram of the automatic telephone number indicating device of the present invention connected within a two party line.

The automatic telephone number indicating device of the present invention is shown generally by the reference numeral 10 in FIG. 1 and is connected within the remote telephone circuit of one party of a two party system. The telephone system originates at the central office (c.o.) and includes a tip line $T_{co}$ and a ring line $R_{co}$. At the remote location, a first party has a telephone set 12 and a second party has a telephone set 14 that are each connected to their own individual tip and ring lines branching off the main line coming from the central office. As shown in FIG. 1, set 14 runs off a tip and ring line wherein T1 and R1 designate the customer side of the device and T and R designate the central office side of the device 10. The device 10 includes a current detection circuit 16 shown connected within the ring line of the second party which is called the tip party. The first party is therefore called the ring party. The detection circuit 16 may include a current protection means connected within the ring line. When the phone set 14 is taken off hook, a loop current is generated within the tip and ring loop that is detected by a current detection switch within the current detection circuit 16.

Once the current is detected, the current protection means takes over and conducts the current and relieves the current detection switch.

The detection circuit 16 triggers a ground mark enable circuit 20 which is connected to the ground mark 22. The enable circuit 20 enables a ground mark latching circuit 24 to permit a ground mark 22 to be detected by the central office during an interrogation test period. The enable circuit 20 includes a means for holding the enable circuit triggered for a predetermined time period. The ground mark latching circuit 24 connects the ground mark 22 to both legs of the tip and ring circuit of the telephone loop of the second party.

A ground mark disable circuit 26 disables the ground mark circuit 24 in response to a voltage being present across the tip and ring circuit. The disable circuit 26 is rendered inoperative in response to an interrogation signal from the central office. The interrogation signal includes the removal of the potential difference between the tip and ring lines. The removal of the potential difference renders the voltage monitor 26 inoperative. Normally, the ring line is at minus 48 volts DC with respect to tip. However, during the interrogation, the central office places the tip line also at negative 48 volts thereby removing the potential difference between the tip and ring lines. Alternatively, the central office may remove the voltage on the ring line leaving the ring line floating while tip is connected to negative 48 volts. Thus, during this interrogation, the disable circuit 26 is no longer disabling the ground mark 24 which permits the circuit 24 to be enabled by the circuit 20.

When the ground mark latching circuit 24 is enabled, the ground mark 22 will be present in the circuit between ground and the tip line or between ground and the tip and ring lines depending on whether the 48 volts is applied only to tip or to both tip and ring. The central office will test for the ground mark between the ground and tip or between ground and tip and ring. If the mark is detected, the central office then will know that telephone set 14 is off hook and that the tip party is the one making an outgoing call. A latching circuit 28 may be included within the ground mark circuit 24 to hold the ground mark circuit 24 enabled for the entire interrogation time period.

Figure 2:
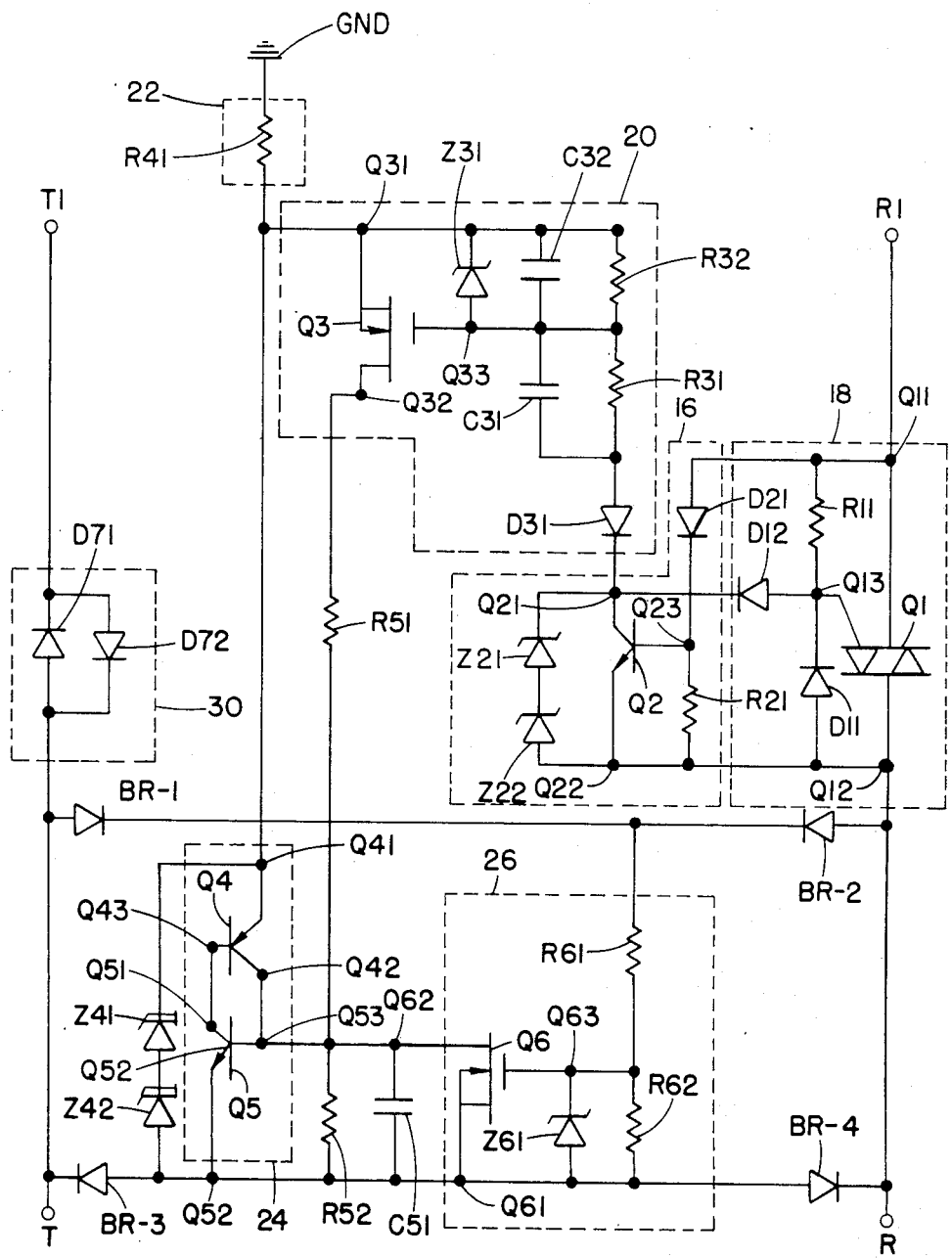
FIG. 2 is a schematic diagram of the automatic telephone number indicating device of the present invention.

FIG. 2 is a schematic diagram of one embodiment of the device shown in FIG. 1. The current detection circuit 16 includes a solid state unilateral switch Q2 having first and second terminals Q21 and Q22 and a gate Q23 connected to the ring line of the remote telephone circuit for rendering the switch Q2 conductive in response to the loop current generated by the telephone set being taken off hook. The loop current will flow through a diode D21 and resistor R21 to turn on switch Q2. The value of resistor R21 will be selected so that a current of at least 10 milliamperes is required to turn on switch Q2. This will ensure that switch Q2 will only turn on from the off hook loop current and not from other transient loop currents that may be present.

In the illustrative embodiment of FIG. 2, the current protection circuit 18 includes a bilateral switch Q1 having first and second terminals Q11 and Q12 connected in series with the ring line and a gate Q13 connected to terminal Q21 of the switch Q2 through diode D12. With switch Q2 on, current will flow from R11 to the gate Q13, through diode D12 and switch Q2 to the terminal Q12 and to the ring terminal R which triggers switch Q1. The current flow will then flow through the switch Q1, and Q2 will shut off due to lack of sufficient voltage to generate the bias current. Switch Q2 will no longer be in the circuit and is thereby protected from any surge current that may occur. Thus, each time the customer takes the phone off hook, switch Q2 will momentarily turn on to trigger the enable circuit 20. However, the current protection means may be eliminated and the gate Q23 of the switch Q2 is connected directly to the ring line. Alternatively, switch Q1, resistor R11 and diode D12 may be removed and diode D21 placed in the ring line in parallel with diode D11. In this case, when the customer goes off hook, current will flow through diode D21 and base Q23 and resistor R2 to turn on switch Q2. Diode D21 becomes a current bypass means that effectively protects switch Q2 from overcurrents.

The enable circuit 20 includes a unilateral switch Q3 having first and second terminals Q31 and Q32 and a gate Q33 which is connected to the terminal Q21 of the switch Q2. The terminal Q31 is connected to ground through a ground mark 22 which, in the illustrative embodiment shown in FIG. 2, is a resistor R41. When the switch Q2 is turned on by the off hook current flow, there will be a small current flow from ground to the ring terminal R through the resistors R41, R32 and R31, a diode D31 and the switch Q2. This current flow will charge the gate Q33 to turn on the switch Q3. Resistor and capacitor time constant circuits formed by resistor R32 and capacitor C32 and resistor R31 and capacitor C31 are charged to a voltage limited by zener diode Z31. Resistor R31 is designed to be a high DC resistance, while capacitor C31 provides low impedance to quickly charge capacitor C32 within the brief period switch Q2 is on. When the switch Q2 is turned off by switch Q1, the current flow from ground through switch Q3 to ring terminal R is eliminated. The capacitor C32 keeps the switch Q3 on for the time period determined by the RC time constant formed by resistor R32 and capacitor C32. This time period can be designed for any amount and is generally designed for 100 to 200 milliseconds. At the same time, resistor R31 subsequently discharges capacitor C31 to reset capacitor C31 to the fully discharged state.

The ground mark latching circuit 24 applies the ground mark 41 between tip and ring during the entire interrogation period. The ground mark latching circuit 24 includes a solid state unilateral switch Q4 having first and second terminals Q41 and Q42 connected in series with the ground mark R41. Solid state unilateral switch Q5 having first and second terminals Q51 and Q52 is connected between the unilateral switch Q4 and the tip and ring lines T and R of the remote circuit. The switch Q5 also includes a gate Q53 which is connected to the terminal Q32 through a resistor R51.

The terminal Q42 is connected to the base Q53 of the switch Q5, and the base Q43 is connected to the terminal Q51 of the switch Q5. When the switch Q3 is turned on, there will be a current flow from ground, through resistor R41, switch Q3, resistor R51 to the base Q53 of switch Q5 forward biasing switch Q5 to turn switch Q5 on. The turning on of switch Q5 will induce a flow of current from ground through resistor R41 through the emitter Q41 and base Q43 of switch Q4 which biases switch Q4 to turn switch Q4 on. There will then be a current flow from ground, resistor R41, through emitter collector junction Q41, Q42 to the base Q53, which will then keep switch Q5 on for the entire time there is a current flow from the ground to the tip line or tip and ring. Transistor Q5 provides bias current to gate Q43 keeping transistor Q4 on, which in turn biases gate Q53 keeping Q5 on. This regenerative flow of current provides the latching function.

The ground mark disable circuit 26 normally disables the ground mark latching circuit 24 to prevent the ground mark from being applied during normal telephone conditions. The disable circuit 26 includes a solid state unilateral switch Q6 having first and second terminals Q61 and Q62 and a gate Q63 connected to the tip and ring lines T and R of the remote circuit. The switch Q6 will be rendered conductive in response to a voltage across the tip and ring lines. A diode bridge circuit includes diodes BR-1, BR-2, BR-3 and BR-4 connected across the tip and ring lines to permit Q6 to be turned on regardless of the polarity of the voltage on the remote circuit. The voltage across tip and ring, rectified by the diode bridge, appears across the voltage divider formed by resistors R61 and R62. The voltage potential, as limited by zener diode Z61 will be across the gate source junction Q63, Q61 turning switch Q6 on. The terminal Q62 of the switch Q6 is connected to terminal Q32 of switch Q3 through resistor R51 and to the gate Q53 of the switch Q5. With the switches Q6 and Q3 turned on, there will be a small current flow from ground through resistor R41, through switch Q3 and resistor R51, through switch Q6 to the ring line. Switch Q6 in an on state represents a short across the base emitter junction Q53, Q52 of switch Q5, producing less than the required bias voltage for Q5 to turn on. Thus, the disable circuit 26 will prevent the ground mark latching circuit 24 from turning on during the entire time there is any minimal voltage across tip and ring.

The ground mark disable circuit 26 is disabled in response to an interrogation signal from the central office which permits the ground mark and latching circuit 24, 28 to be enabled. The initial step in applying the interrogation signal includes the removal by central office of all potential from tip and ring. The removal of the voltage across tip and ring removes the biasing voltage across resistor R62. The charge at the gate Q63 discharges through resistor R62 turning off switch Q6. The current flowing through resistor R51 will then be routed to the base Q53 of switch Q5 turning switch Q5 on. As described above, when switch Q5 is turned on, the ground mark latching circuit 24 is enabled, which permits the ground mark 22 to be applied between ground and tip in response to the interrogation signal.

Once the central office determines that a phone in the two party line has gone off hook, the central office will interrogate the line to search for the ground mark. To interrogate the loop, the central office first removes the potential difference between the tip and ring lines. The central office then applies the interrogation signal by connecting the tip line to negative 48 volts which is already present on the ring line. Alternatively, the central office may apply the negative 48 volts only to the tip line while removing it from the ring line. During either type of interrogation, ground remains at positive. Thus, with switches Q4 and Q5 turned on as described above, the ground mark 22 can now be detected between ground and the tip line or ground and tip and ring by the current flowing from ground, at positive potential, to tip or tip and ring, at negative potential. The central office will test the circuit between ground and tip or tip and ring and if current flows through the resistor R41, the central office will know that the party having the device is the one off hook.

At the end of the interrogation, the central office reconnects the tip line to the positive terminal of the talk battery with the negative 48 volts connected to ring. This will again provide a voltage across the tip and ring circuit providing the biasing voltage to turn switch Q6 on again. Switch Q6 then shorts the base Q53 of the switch Q5 to turn switch Q5 off. Switch Q4 will then turn off releasing the latch and removing the ground mark.

A balancing circuit 30, including diodes D71 and D72, may be connected within the tip line to provide a diode drop equal to the drop in the ring line from the bilateral switch Q1. This will eliminate a hum within the circuit that may arise due to the additional diode drop of Q1 being in only one line.

In the illustrative embodiment shown in FIG. 2, the switch Q1 may be any bilateral switch such as a triac or SCR. Switches Q2 and Q5 are npn transistors. Latching switch Q4 is a pnp transistor. Switches Q3 and Q6 are field effect transistors. Although FIG. 2 is shown with the above components, equivalent solid state components may be substituted without departing from the spirit of the invention.

While illustrative embodiments of the subject invention have been described and illustrated, it is obvious that various changes and modifications can be made therein without departing from the spirit of the present invention which should be limited only by the scope of the appended claims.

What is claimed is:

1. An automatic number indicating device for connection within a two leg remote telephone circuit of one party of a multi-party telephone line for providing an indication at a telephone central office that said party's telephone is off hook in response to an interrogation signal from said central office, said indicating device comprising:

a current detection circuit connected within a first leg of said remote circuit, said detection circuit including a unilateral switch having first and second terminals and a gate connected to said first leg of the remote circuit for rendering said switch conductive in response to a loop current within said remote circuit caused by said party's phone being off hook;

a ground mark enable circuit being triggered by said current detection circuit, said enable circuit being connected to ground through a ground mark;

a ground mark latching circuit for connecting said ground mark to both legs of said remote circuit for a predetermined time, said ground mark latching circuit being enabled by said ground mark enable circuit;

a ground mark disable circuit for disabling said ground mark latching circuit in response to a voltage across both legs of said remote circuit and for enabling said ground mark latching circuit in response to an interrogation signal from the central office;

whereby said ground mark will be applied to said remote circuit between ground and at least one leg of said remote circuit in the presence of an interrogation signal from the central office during the time period that said enable circuit is on thereby indicating that said party's phone is off hook.

2. The automatic number indicating device of claim 1 wherein said ground mark enable circuit includes means for sustaining said ground mark enable circuit triggered for a predetermined time.

3. The automatic number indicating device of claim 1 wherein said current detection circuit includes a current protection means.

4. An automatic number indicating device for connection within a two leg remote telephone circuit of one party of a multi-party telephone line for providing an indication at a telephone central office that said party's telephone is off hook in response to an interrogation signal from said central office, said indicating device comprising:

a current detection circuit connected within a first leg of said remote circuit, said detection circuit including a unilateral switch having first and second terminals and a gate connected to said first leg of the remote circuit for rendering said switch conductive in response to a loop current within said remote circuit caused by said party's phone being off hook;

a current protection means including a solid state bilateral switch having first and second terminals connected in series with said remote circuit and a gate connected to said current detection circuit for rendering said bilateral switch conductive in response to the detection of an off hook current flow;

a ground mark enable circuit being triggered by said current detection means, said enable circuit being connected to ground through a ground mark, said enable circuit including a second unilateral switch having first and second terminals and a gate connected to said current detection circuit for rendering said second unilateral switch conductive in response to said first unilateral switch being conductive, said enable circuit including means for sustaining enable circuit triggered for a predetermined time period;

a ground mark latching circuit for connecting said ground mark to both legs of said remote circuit for a predetermined time, said ground mark latching circuit being enabled by said ground mark enable circuit;

a ground mark disable circuit for disabling said ground mark circuit in response to a voltage across both legs of said remote circuit and being rendered inoperative in response to an interrogation signal from the central office;

whereby said ground mark will be present in said remote circuit between ground and at least one leg of said remote circuit in the presence of an interrogation signal from the central office during the time period that said enable circuit is on thereby indicating that said first party's phone is off hook.

5. The indicating device of claim 4 further including a balancing means connected within the second leg of the remote telephone circuit.

6. The indicating device of claim 4 wherein the means for holding the enabling circuit triggered for a predetermined time period consists of at least one resistance-capacitance time constant circuit.

7. The indicating device of claim 4 wherein said ground mark consists of a resistor.

8. The indicating device of claim 4 further including a diode bridge circuit for rendering the disable circuit operative regardless of the voltage across the remote circuit.

9. The indicating device of claim 4 wherein said disable circuit includes a solid state unilateral switch rendered conductive in response to a voltage across the remote circuit.

10. The indicating device of claim 4 wherein said ground mark latching circuit includes at least one solid state unilateral switch rendered conductive in response said enable circuit being conductive and disable circuit being nonconductive.

11. An automatic number indicating device for connection within a two leg remote telephone circuit of one party of a multi-party telephone line for providing an indication at a telephone central office that said party's telephone is off hook in response to an interrogation signal from said central office, said indicating device comprising:

a current detection circuit including a first solid state unilateral switch having first and second terminals and a gate connected to a first leg of the remote telephone circuit for rendering the first unilateral switch conductive in response to an off hook current flow in the remote circuit;

a current protection circuit including a solid state bilateral switch having first and second terminals connected in series with said first leg of the remote circuit and a gate connected to the first terminal of said first unilateral switch for rendering said bilateral switch conductive in response to said first unilateral switch being conductive thereby bypassing and rendering nonconductive said first unilateral switch;

a ground mark enable circuit including a second unilateral switch having first and second terminals and a gate connected to the first terminal of said first unilateral switch, the first terminal of said second unilateral switch being connected to ground through a ground mark;

a circuit means connected between the first terminal and the gate of said second unilateral switch and to the first terminal of said first unilateral switch for rendering said second unilateral switch conductive in response to said first unilateral switch being conductive, said circuit means including a means for holding said second unilateral switch on for a predetermined time period after said first unilateral switch has been rendered nonconductive;

a ground mark latching circuit including a third solid state unilateral switch having first and second terminals connected between said ground mark and the first and second legs of said remote circuit, and a gate connected to the second terminal of said second unilateral switch for rendering said third unilateral switch conductive in response to said second unilateral switch being conductive;

a ground mark disable circuit including a fourth solid state unilateral switch having first and second terminals and a gate connected to said first and second legs of said remote circuit for rendering said fourth unilateral switch conductive in response to a voltage across said first and second legs, and for rendering said fourth unilateral switch nonconductive in response to an interrogation signal from the central office, the second terminal of said fourth unilateral switch being connected to the second terminal of said second unilateral switch and to the gate of said third unilateral switch for rendering said third unilateral switch nonconductive when said fourth unilateral switch is conductive;

whereby said ground mark will be applied to said circuit between ground and at least one leg of said remote circuit in response to said second unilateral switch being conductive and said fourth unilateral switch being nonconductive thereby indicating that said first party's phone is off hook.

12. The indicating device of claim 11 wherein said ground mark latching circuit includes a fifth solid state unilateral switch having first and second terminals connected between said ground mark and the gate of the third unilateral switch, and a gate connected to the first terminal of said third unilateral switch.

13. The indicating device of claim 12 further including a diode bridge circuit connected between both legs of the remote circuit for allowing said fourth solid state unilateral switch to be conductive regardless of the polarity of the voltage across the remote circuit.

14. The indicating device of claim 13 further including a balancing means including two diodes connected within the second leg of the remote circuit.

15. The indicating device of claim 14 wherein said circuit means includes at least one resistance-capacitance time constant circuit.

16. The indicating device of claim 15 wherein said ground mark includes of a resistor.

* * * * *